(12) United States Patent
Völckers

(10) Patent No.: US 7,414,548 B2
(45) Date of Patent: Aug. 19, 2008

(54) CONTINUOUSLY ACTUATABLE KEYS PERTAINING TO A KEYBOARD COMPRISING AN INTEGRATED SIGNAL DETECTION ELEMENT, AND METHOD FOR SIGNAL PROCESSING

(76) Inventor: Oliver Völckers, Insterburgallee 15, Berlin D-14055 (DE)

( * ) Notice: Subject to any disclaimer, the term of this patent is extended or adjusted under 35 U.S.C. 154(b) by 209 days.

(21) Appl. No.: 10/547,351

(22) PCT Filed: Mar. 9, 2004

(86) PCT No.: PCT/EP2004/002392

§ 371 (c)(1),
(2), (4) Date: Mar. 3, 2006

(87) PCT Pub. No.: WO2004/081958

PCT Pub. Date: Sep. 23, 2004

(65) Prior Publication Data

US 2006/0152390 A1      Jul. 13, 2006

(30) Foreign Application Priority Data

Mar. 12, 2003   (DE)   ................................. 103 11 294

(51) Int. Cl.
*H03K 17/94*   (2006.01)
(52) U.S. Cl. ........................... 341/22; 345/157; 200/512
(58) Field of Classification Search ................. 341/22, 341/34; 345/157; 200/512
See application file for complete search history.

(56) References Cited

U.S. PATENT DOCUMENTS

| | | | | |
|---|---|---|---|---|
| 4,755,634 A | * | 7/1988 | Pepper, Jr. ............... | 178/18.01 |
| 5,181,030 A | * | 1/1993 | Itaya et al. ..................... | 341/20 |
| 5,969,698 A | * | 10/1999 | Richard et al. .................. | 345/7 |
| 6,504,492 B1 | * | 1/2003 | Muurinen ..................... | 341/22 |
| 6,614,905 B1 | * | 9/2003 | Kristensen ................... | 379/368 |
| 6,977,644 B2 | * | 12/2005 | Endo et al. .................. | 345/157 |
| 7,006,077 B1 | * | 2/2006 | Uusimaki .................... | 345/173 |
| 2002/0180708 A1 | * | 12/2002 | Kaelbling ................... | 345/169 |
| 2004/0217944 A1 | * | 11/2004 | Kong .......................... | 345/173 |
| 2005/0141681 A1 | * | 6/2005 | Graiger ................... | 379/90.01 |
| 2006/0129928 A1 | * | 6/2006 | Qiu ............................. | 715/535 |

FOREIGN PATENT DOCUMENTS

WO   WO 87/05433   * 11/1987

* cited by examiner

*Primary Examiner*—Timothy Edwards, Jr.

(57) ABSTRACT

The aim of the invention is to develop a keyboard for compact mobile electronic appliances, said keyboard comprising an integrated signal detection element and enabling simple data input and simultaneous continuous control possibilities using a plurality of keys; an electronic inquiry mechanism for actuating the keys; and an evaluation method for a momentary key position during the continuous actuation of individual keys. To this end, keys which are applied in a mobile manner and provided with a spring suspension are mechanically coupled, on the lower side thereof, to a continuous strip conductor extending over at least one key and having a high electrical resistance, such that when the keys are actuated, the strip conductor comes into contact with another strip conductor, in the actuation position, said other strip conductor extending over all of the keys and having a low electrical resistance, and an analog-digital converter AD0 determines the electrical resistance or voltage drop between the strip conductor and an end of the strip conductor, said measuring value being unequivocally associated with a defined key and the actuation position on said key.

12 Claims, 6 Drawing Sheets

CONTINUOUSLY ACTUATABLE KEYS PERTAINING TO A KEYBOARD COMPRISING AN INTEGRATED SIGNAL DETECTION ELEMENT, AND METHOD FOR SIGNAL PROCESSING

The invention relates to a keyboard with maneuverable keys that can be pressed and tilted and that are equipped with a signal detection element that registers the key actuation, and a method to translate the electrical impulses initiated by the key actuation into signals identifying the position of the actuation by detecting the force and position of the key actuation.

According to the state-of-the-art, keyboards and input devices for cursor control are typically conceived as separate units, so that their combination requires double evaluation electronics and software.

With notebook computers, for example, a little joystick is frequently mounted near the space bar in order to control the mouse pointer. This joystick can be implemented e.g. on the basis of strain gauge. As an alternative, a flat sensor on capacitive basis is frequently used for mouse control. In both cases, the technical effort to evaluate the complex signals is significant.

With mobile phones that include organizer functions, so-called smart phones, a solution is known where a flap keyboard is mounted onto a touch screen. If the device is used for data input, then the keys can be placed on the touch screen and any key actuation will then actuate a specific position of the touch screen. This saves separate electronics for the key evaluation. However, the flap keyboard only allows to use either the keyboard or the touch screen at one time.

There also numerous proposals to extend keyboards as e.g. the U.S. Pat. No. 5,973,621 (David Levy 1999) or the U.S. Pat. No. 5,528,235 (Edward Lin 1991). Such extensions on the basis of electrical switches are mechanically costly and vulnerable and have not prevailed as a result.

It is a known technique to code keys with analog values by means of a voltage divider (FIG. 19). A specific voltage can be metered at each of the resistors R1, R2, R3 and R4. When one of the pushbuttons S1, S2, S3 or S4 is pressed, this voltage is led to the analog/digital converter (AD). As long as no pushbutton is pressed and thus no contact closed, the AD meters a positive voltage due to the pullup resistor Rp.

This allows to scan the whole keyboard with only two or three cables. While the cost for the leads is lower, there is higher cost for the decoding by means of the analog/digital converter. For these reasons this technology is typically limited to those cases where the lower lead count brings a significant advantage.

Another known technique is the foil potentiometer (FIG. 17, section view). In their simplest form they consist of a strip of flexible foil 51, which is partly coated with a material with a high electrical resistance (between 100 Ohms and approx. 500 Kiloohms per 10 cm) such as graphite 53, and a second foil 71 that is partly coated with a material with a low electrical resistance 72 such as silver (less than 10 Ohms per 10 cm) and thirdly a spacer 61 that keeps both foils at a distance of approx. 0.02 mm up to 1.0 mm during their resting state. The spacer 61 exhibits an opening 211 which allows a contact between the conductive coatings 53 and 72 when mechanical pressure is applied. At the edge of the foils 51 and 71, the coatings are connected to the electrodes 202 and 203 (FIG. 20, view from above). Another electrode 222 is located at the coating of foil 71 (FIG. 22, view from above). The electrodes allow a contact with the evaluation electronics. When actuated (FIG. 18) the flexible foil 51 is slightly bent at the touched position, so that the spacer 61 is bridged and an electrical contact between 53 and 72 is created. The electrical resistance between the electrodes 202/203 of the resistively coated foil 51 on the one side and the electrode 222 on the foil 71 on the other side is now proportional to the distance between the contact point and their ends.

If the foil potentiometer is connected as a voltage divider (FIG. 23), then the voltage metered at the analog/digital-converter AD is proportional to the position of the tap point.

Alternatively, both the actuation point and the length of the resting section may be determined. To this end, a voltage is applied at the electrode 222 and the Ohm's resistance between the electrodes 202 and 203 is measured. Both measured values correspond to the distance to both ends, whereas the sum of both measured values subtracted from the total resistance between 202 and 203 correspond to the length of the resting section. This is because actuation on a section or on two points instead of a single point creates a short circuit between both points, which reduces the resistance between 202 and 203 proportionally corresponding to the distance of these points. This is also state-of-the-art in the area of foil sensors.

While foil sensors allow a continuous adjustment in a simple manner, they do not deliver any tactile feedback due to their flat form factor. Therefore they do not offer a comfortable data input like ordinary keyboards and have only enjoyed limited success.

The goal of the invention is to reduce the cost of mobile electronic devices that have keys as input elements, by reducing the volume and the weight, the number of parts as well as the energy consumption, and simplifying the operation, where the keyboard must be robust against rough transport conditions and manufacturer's tolerances.

The invention is based on the task to develop a keyboard that is suitable for the employment in compact mobile electronic devices with an integrated signal detection element, that allows data input with unlimited comfort and at the same time a continuous control for a plurality of keys, interrogation electronics for the keyboard actuation and a method to determine the current key position with a continuous actuation of particular keys.

The task is solved by the features described in the independent patent claims.

The invention will be demonstrated by means of an example. The figures are as follows:

FIG. 1: circuit diagram of a keyboard for voltage measurements with an AD converter according to the invention FIG. 2: circuit diagram of a keyboard for resistance measurements with two AD converters according to the invention FIG. 3: circuit diagram of a keyboard for resistance measurements with three AD converters according to the invention FIG. 4: circuit diagram of a keyboard for voltage measurements and two calibration electrodes according to the invention FIG. 5: upper foil of the signal detection element with printed conductive paths FIG. 6: middle foil of the signal detection element with punched openings FIG. 7: lower foil of the signal detection element with printed conductive paths FIG. 8: example of key caps with labels FIG. 9: upper foil of the signal detection element with printed conductive paths FIG. 10: middle foil of the signal detection element with punched openings FIG. 11: lower foil of the signal detection element with printed conductive paths FIG. 12: example of key caps with labels FIG. 13: key with actuator (cutaway view)

FIG. 14: slightly pressed key (cutaway view)

FIG. 15: strongly pressed key (cutaway view)

FIG. 16: pressed and tilted key (cutaway view)

FIG. 17: architecture of a foil potentiometer (cutaway view)
FIG. 18: foil potentiometer, actuated state (cutaway view)
FIG. 19: keyboard encoded with resistance cascade
FIG. 20: foil potentiometer, upper foil
FIG. 21: foil potentiometer, middle foil
FIG. 22: foil potentiometer, lower foil
FIG. 23: circuit diagram of a conventional foil potentiometer The solution is to mount a signal detection element, e.g. a foil potentiometer underneath a group of maneuverable keys in such a way that a pressed key can be assigned a specific electrical resistance at the electrodes of the foil potentiometer. The tilt of a key resp. a variable touch position on the key leads to a variable contact point and thus to a change of electrical resistance. However, if no key is pressed, then no electrical contact between opposite electrodes is established.

Additionally, the applied force on each key can optionally be determined by measuring the reduction of total resistance of the foil potentiometer. As a higher force on a key is accompanied with a deformation of the soft key underside, a longer resting section and a correspondingly reduced total resistance, the applied force can be derived from the difference of the resistance.

Assuming a sufficient accuracy of measurement, a huge number of keys as well as their actuation position can be interrogated in this manner with a single foil potentiometer. This requires only a small number of leads (a minimum of two without force measurement, three with force measurement).

FIG. 1 shows the circuit diagram of a keyboard according to the invention. P1-S1, P2-S2 etc. constitute units each: A key actuation closes e.g. the contact S1 and the resistance of the potentiometer P1 results from the actuation position. Rp is a pull-up resistor which pulls the input of the analog-digital-converter AD to a defined value during the contactless resting state. The foil potentiometer composed of P1 to P4 corresponds to voltage divider, so that the AD converter measures a voltage that relates to a specific key and actuation position. The example exhibits four keys, but it would be the same for any other number of keys.

FIG. 2 shows how the same keyboard can be evaluated with a different measuring assembly. With an additional AD converter it is possible to determine the force that is applied on a key. A stronger force deforms the soft key underside and thus creates a longer resting section on the foil potentiometer, i.e. a section with a short-circuit. Now the electrical resistance between the actuated key S1 to S4 and AD1 and AD2 is measured by means of the AD converters AD1 and AD2 and is compared to the total resistance from P1 to P4 during the resting state. The reduction of resistance is exactly related to the short-circuit section, thus the resting section of the soft key underside and thus to the applied force.

FIG. 1 and FIG. 2 demonstrate arrangements where the continuous actuation of arbitrary keys on a single axis is evaluated. This corresponds to a movement to the side of the actuation position or the tilted actuation of a key.

FIG. 3 shows how an evaluation is also possible along two axes for selected keys, if additional AD converters are available. In this case, P1a and P1b constitute two potentiometers that are controlled by a single key (FIG. 12, element 121). Three measuring points at the edge of a circle are sufficient to determine the focal point of contacting; namely that point on the circle area that has the calculated distance to the three measuring points.

In order to increase the reliability and precision, it is possible to allow for reference points at one or more points of the keyboard. On FIG. 4, CAL1 and CAL2 serve as calibration values for measurement with an AD converter; the value of CAL1 lies directly between P1 and P2, while the value of CAL2 lies directly between P2 and P3. The calibration can be performed as long as no key is actuated. The reference points show precisely a relative proportion to the key actuations, even if the total resistance might vary due to temperature changes etc.

It is possible to use a foil potentiometer as a signal detection element of a keyboard according to the invention. As an example, FIG. 5 to 7 show a foil potentiometer that consists of three foils: an upper foil (FIG. 5), a middle foil (FIG. 6) and a lower foil (FIG. 7). These three foils lie flat over another and are fixed to each other, e.g. by lamination. The middle foil could be replaced by a printed isolation layer (dielectric) that could be printed onto either the upper or the lower foil.

The upper foil (FIG. 5, 51) is printed with conducting paths made from an electrically well conducting material 52 and conductive paths made from a resistive material 53. On one side there is the contact bar 54 in order to secure the connection to a measuring electronics.

The middle foil (FIG. 6, 61) contains notches (openings) 62 that allow a mechanical and electrical contact between the upper and the lower foil. Conductive paths with a low electrical resistance 72 are printed onto the lower foil (FIG. 7, 71).

Figure 13:
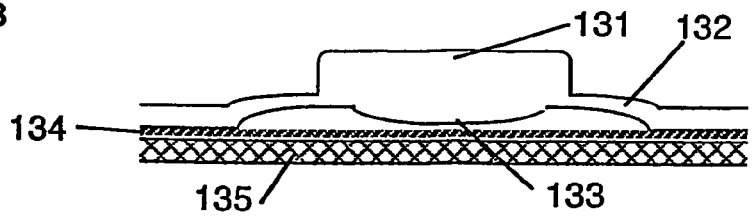
FIG. 13 shows a key in cutaway view in the non-actuated state. The actuator 133 has no mechanical contact with the signal detection element (foil potentiometer) 134.
Figure 14:
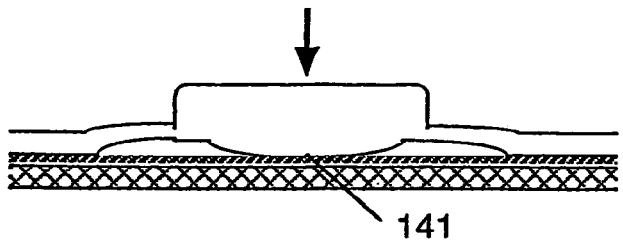
Figure 15:
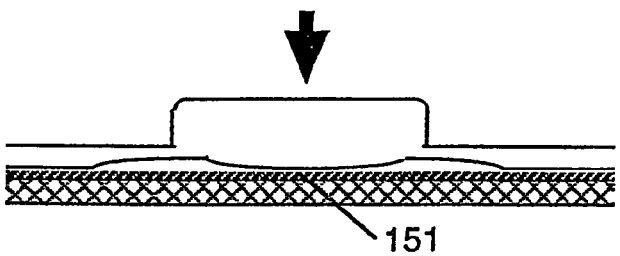

FIG. 14 shows the same key as FIG. 13, however in the actuated state. The actuator 133 lies on the middle of the key 141 and establishes a corresponding electrical contact. When the force is increased, as shown in FIG. 15, then the resting section of the actuator 151 is increased. The total electrical resistance would slightly shrink because of this tiny short-circuit.

Figure 16:
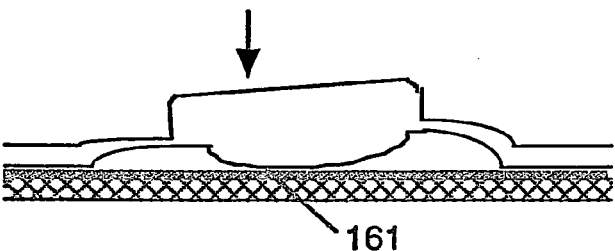
Figure 17:
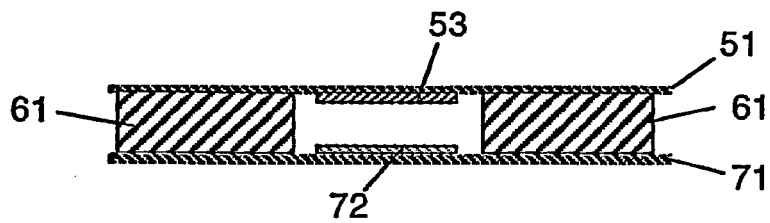
Figure 18:
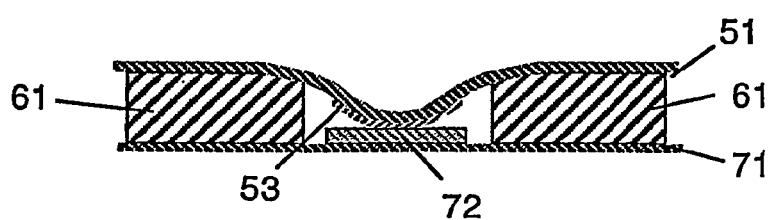
Figure 19:
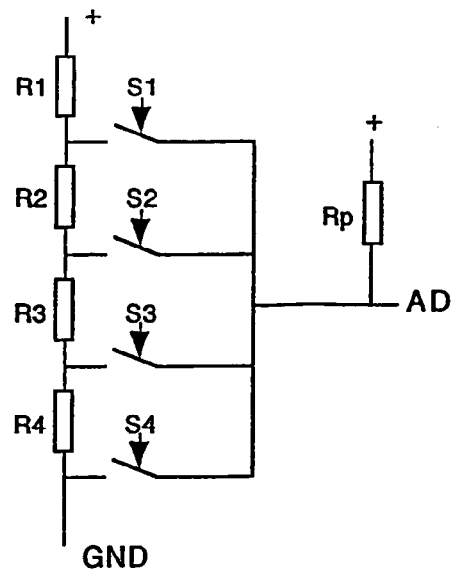
Figure 20:
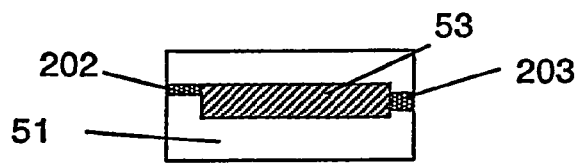
Figure 21:
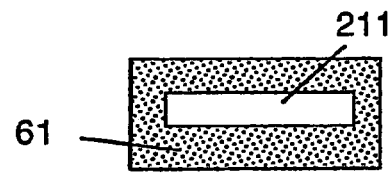
Figure 22:
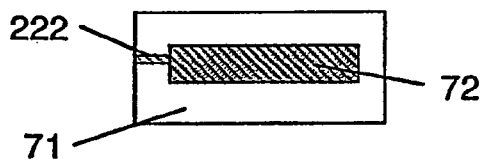
Figure 23:
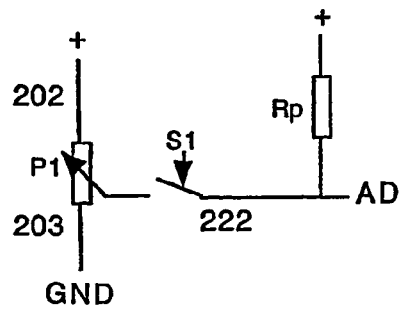

FIG. 16 shows how the key has been actuated in a tilted manner. Even this leads to a safe contact with this keyboard. The position of the contact may be determined with the corresponding measurements.

Figure 8:
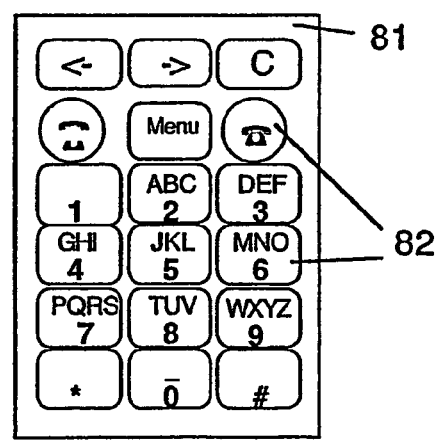
FIG. 8 shows an example of a key arrangement that works with the foil potentiometer from FIG. 5 to 7. These keys are mechanically accentuated and maneuverable with a click.
Figure 12:
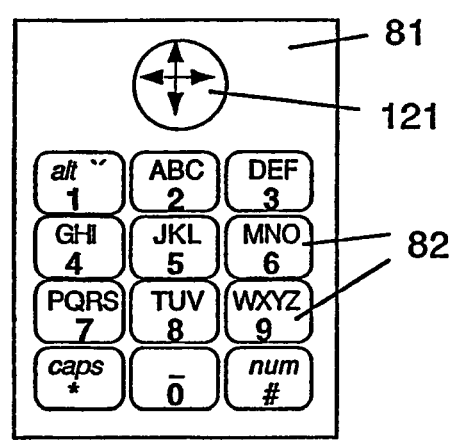

The following applications for the continuously actuatable keys are suggested: With a numeric telephone keypad arranged similar to FIG. 8 it is possible to enter letters by typing them directly on the key; i.e. pressing onto the left side of the key "2" in order to enter an "A". It is also possible to control a cursor arrow key arrangement continuously (FIG. 12, 121).

Furthermore, an embodiment may be provided wherein a soft touch of the keys leads to the display of several input alternatives, and one of the input alternatives is highlighted by means of a cursor, and the position of the cursor is related to the position of the finger on the key.

The advantage of the invention consists in the fact that the key scanning and an analog control function has been integrated into a unified technology. Any key maneuver leads through a measurement of force and position of the actuation to a specific electrical resistance of the output signal, which characterizes the position of the actuation. If a second output signal is evaluated, the applied force of actuation can also be determined. The necessary technical cost for the proposed solution is thus significantly lower than with conventional keyboards with continuous control units.

LIST OF TERMS

AD0 AD converter
P1 with S1 signal detection element
P2 with S2 signal detection element
P3 with S3 signal detection element
P4 with S4 signal detection element
Rp pullup resistor
51 upper foil
52 conductive paths with low resistance
53 conductive paths with high resistance
54 contact bar with three leads
61 spacer
62 openings of spacer
71 lower foil
72 material with a low electrical resistance
73 contact bar
81 casing
82 maneuverable keys
91 contact bar with a total of four leads
101 round hole for a key that can be tilted in any direction
121 key that can be tilted in any direction
131 key caps
132 key suspension
133 actuator
134 signal detection element
135 carrier plate
141 small resting section at the key center
151 large resting section at the key center
161 small resting section at the key side
202, 203, 222 electrodes
211 opening

The invention claimed is:

1. Keyboard with continuously actuatable keys and with an integrated signal detection element, especially for mobile electronic devices, for data input and for analog cursor control and selection of functions, wherein the maneuverable mounted keys (82) are equipped with a suspension (132) and are coupled mechanically at their underside with a continuous conductive path with a high electrical resistance (53) spreading across one or more keys in such a way that after actuation of keys the conductive path (53) touches another conductive path with low electrical resistance (72) spreading across all keys and an analog-digital converter AD0 determines the electrical resistance or the voltage between the conductive path (72) and one end of the conductive path (53), the measured values being assigned to a specific key and actuation position without ambiguity.

2. Keyboard according to claim 1, wherein two analog-digital converters AD1 and AD2 are provided that measure the electrical resistance or the voltage drop between the conductive path (72) and both ends of the conductive path (53), the measured values being assigned to a specific key, to an actuation position as a point on a line and to the resting section (141, 151, 161) without ambiguity.

3. Keyboard according to claim 1, wherein the conductive path (53) is connected with one or more calibration electrodes CAL1 that allow an exact measurement of the electrical resistance at several positions of the conductive path (53), where these measurements are used as relative reference points for the interpretation of measured values at the ends of the conductive path (53), so that a precise measurement is possible even under conditions of production-related or temperature-related fluctuations of the total resistance of the conductive path.

4. Keyboard according to claim 1, wherein the conductive path (53) of the foil potentiometer as a component of a keyboard is divided into several lines lying parallel to each other, the ends of these lines being connected via a conductive path with low electrical resistance to the opposite end of the next line, so that production-related, slight fluctuations of the mounting position of the keys (82) on the foil potentiometer lead to the same deviation of the measured values with every key.

5. Keyboard according to claim 1, wherein the foil potentiometer as a component of a keyboard consists of an upper foil (51), a spacer (61) and a lower foil (71) that are joined to each other, where conductive paths with a high electrical resistance and optional conductive paths with a low electrical resistance have been printed onto the upper foil (51), and conductive paths with a low electrical resistance (72) have been printed onto the lower foil (71), and the conductive paths (53) and (72) keep a short distance of less than 2 mm in their resting position and touch each other when the keys (82) are actuated.

Figure 9:
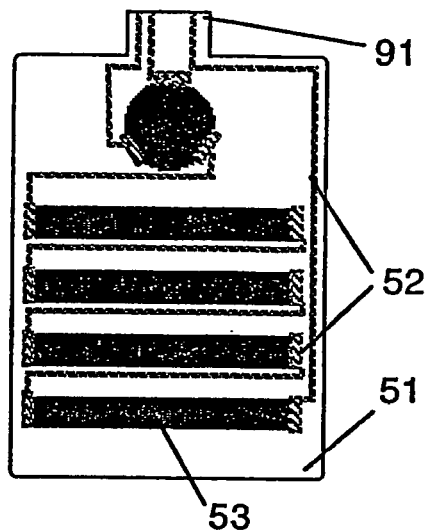
FIG. 9 to 12 are similar to FIG. 6 to 8 except for the difference that one key that is maneuverable along two dimensions requires an extra lead and an additional AD converter. The key 121 can be tilted both in horizontal and vertical direction and this tilt can be measured.
Figure 10:
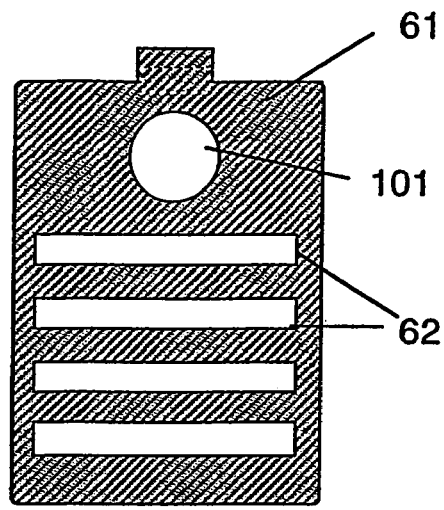
Figure 11:
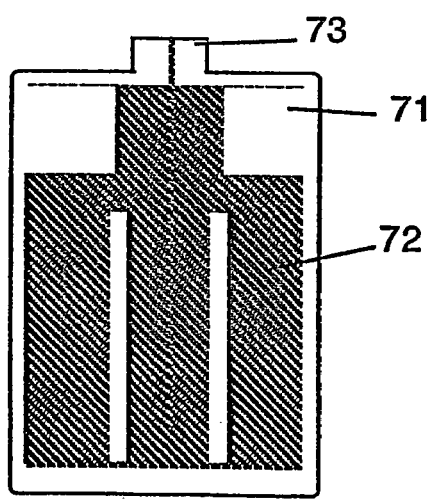

6. Keyboard according to claim 1, wherein three analog digital converters AD1, AD2 and AD3 are provided that measure the electrical resistance or the voltage drop between the conductive path (72) and three ends of the conductive path (53)FIG. 9), where these measured values are unambiguously assigned to a specific key, to the actuation position as a point on a circle area and to the resting area (141), (151), (161).

7. Keyboard according to claim 1, wherein the keys (82) are labeled similar to a numeric telephone keyboard with a digit or character each and with multiple letters of the alphabet, where depending on the mode digits or letters may be entered and different letters may be selected depending on the key actuation on the left side, the center or the right side of the key.

Figure 1:
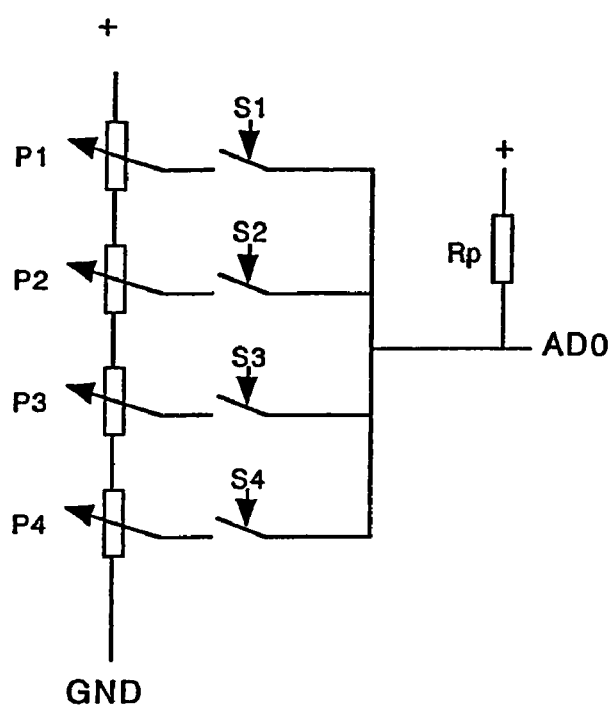
Figure 2:
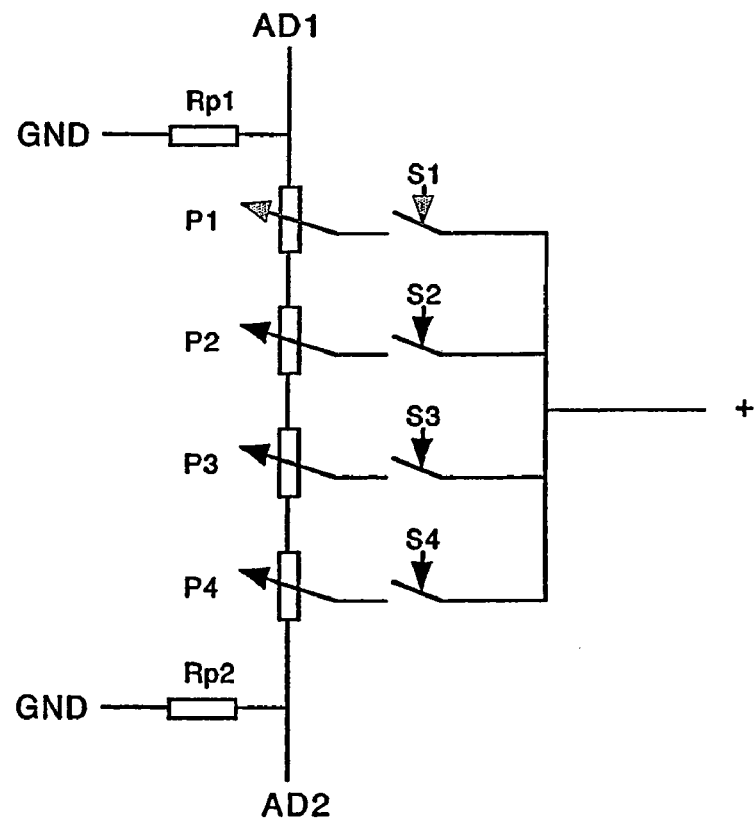
Figure 3:
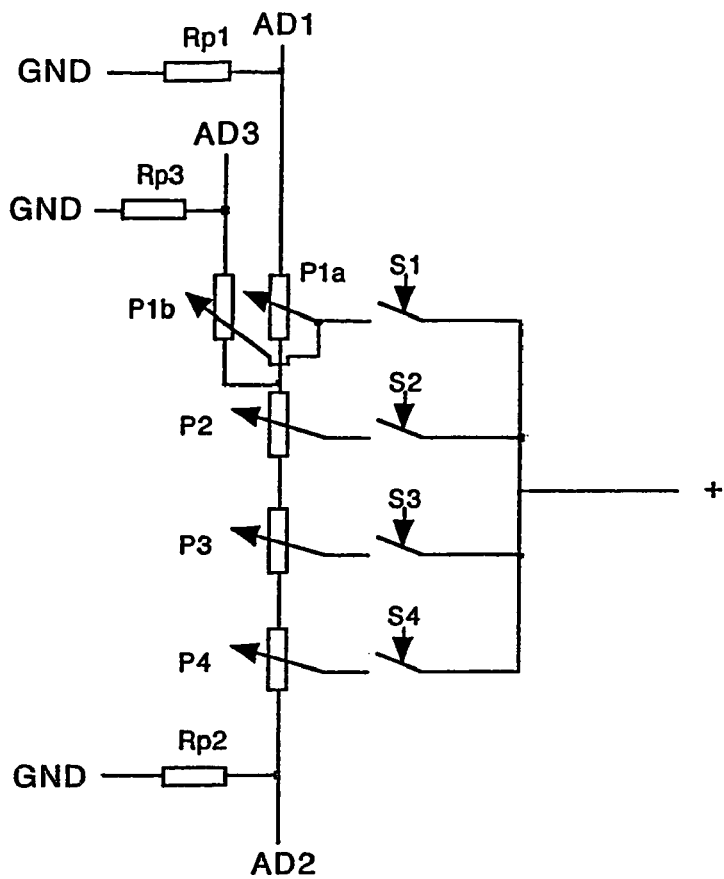
Figure 4:
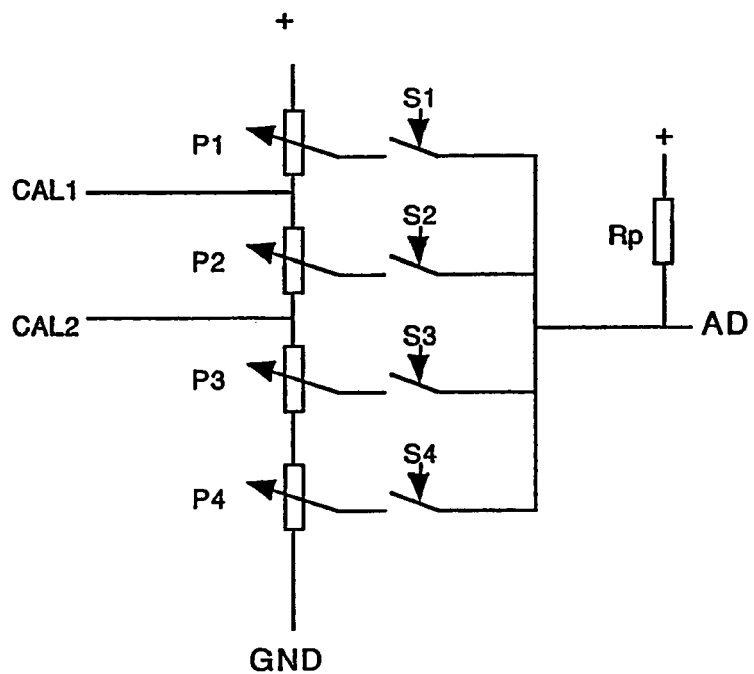
Figure 5:
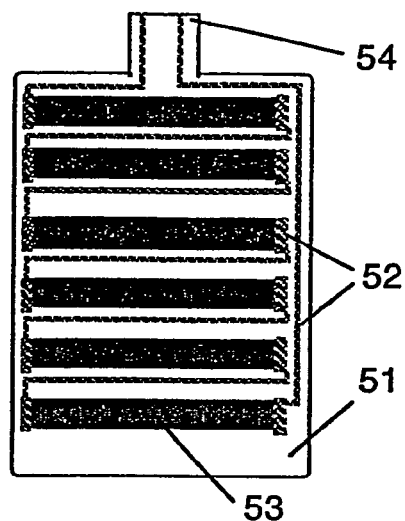
Figure 6:
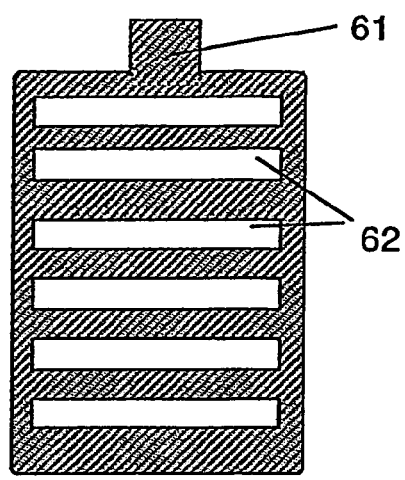
Figure 7:
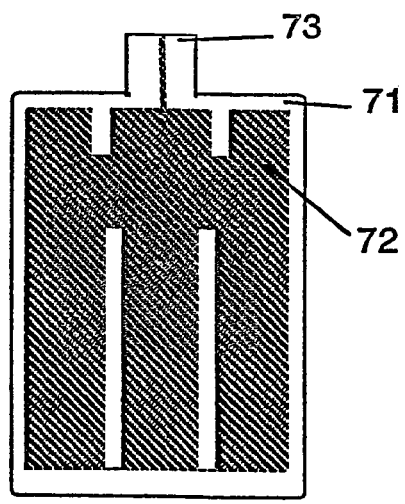

8. Keyboard according to claim 1, where a key (121) is provided that may be actuated at any position of its edge, where the direction of the actuation and the strength of the deflection can be determined as a point on a circle area by evaluating the relationship of the output signals AD1, AD2 and AD3 (FIG. 3) to each other, and where the speed and direction of a cursor movement can be controlled by manipulating the direction and tilt of this key (121).

9. Keyboard according to claim 1, wherein the keys (82) are provided with a key cap (131), a deformable, convex key underside (133) and a flexible suspension (132), so that a mechanical pressure from the top actuates a signal detection element (134) lying on a carrier plate (135) at a position that depends from their actuation position and with a resting area (141), (151), (161) that depends on the applied force.

10. Method for the evaluation of signals of a keyboard according to claim 1, wherein a soft touch of the keys leads to the display of several input alternatives, and one of the input alternatives is highlighted by means of a cursor, and the position of the cursor is related to the position of the finger on the key.

11. Method for the evaluation of signals of a keyboard according to claim 10, wherein the displayed input alternative is selected after the key is released.

12. Method for the evaluation of signals of a keyboard according to claim 10, wherein the displayed input alternative is selected by increased pressure on a key.

* * * * *